(12) United States Patent
Zheng et al.

(10) Patent No.: US 11,127,823 B1
(45) Date of Patent: Sep. 21, 2021

(54) SPLIT GATE STRUCTURE, POWER MOS DEVICE, AND MANUFACTURING METHOD

(71) Applicant: HeJian Technology (Suzhou) Co., Ltd., Suzhou (CN)

(72) Inventors: Yuan Cheng Zheng, Suzhou (CN); Xin Huan Shi, Suzhou (CN)

(73) Assignee: HeJian Technology (Suzhou) Co., Ltd., Suzhou (CN)

( * ) Notice: Subject to any disclaimer, the term of this patent is extended or adjusted under 35 U.S.C. 154(b) by 0 days.

(21) Appl. No.: 15/931,603

(22) Filed: May 14, 2020

(30) Foreign Application Priority Data

Mar. 18, 2020 (CN) .......................... 202010193258.3

(51) Int. Cl.
*H01L 29/40* (2006.01)
*H01L 29/423* (2006.01)
*H01L 21/02* (2006.01)
*H01L 21/765* (2006.01)
*H01L 21/3213* (2006.01)
*H01L 21/28* (2006.01)
*H01L 29/66* (2006.01)

(52) U.S. Cl.
CPC ...... *H01L 29/407* (2013.01); *H01L 21/02255* (2013.01); *H01L 21/28114* (2013.01); *H01L 21/32133* (2013.01); *H01L 21/765* (2013.01); *H01L 29/4236* (2013.01); *H01L 29/42376* (2013.01); *H01L 29/66734* (2013.01)

(58) Field of Classification Search
None
See application file for complete search history.

(56) References Cited

U.S. PATENT DOCUMENTS

| | | | | |
|---|---|---|---|---|
| 2009/0050959 | A1* | 2/2009 | Madson | H01L 29/66727 257/332 |
| 2012/0235229 | A1* | 9/2012 | Probst | H01L 29/401 257/330 |
| 2012/0326227 | A1* | 12/2012 | Burke | H01L 29/7811 257/330 |
| 2013/0302958 | A1* | 11/2013 | Hossain | H01L 29/4916 438/270 |

* cited by examiner

*Primary Examiner* — Erik Kielin
(74) *Attorney, Agent, or Firm* — Idea Intellectual Limited; Margaret A. Burke; Sam T. Yip

(57) ABSTRACT

A split gate structure is disclosed. The split gate structure includes a first polysilicon, a characteristic oxide, and a second polysilicon sequentially disposed in a trench in a vertical direction upward from a bottom of the trench. An upper surface of the characteristic oxide has a height difference less than 1500 Å between a higher center portion and a lower periphery portion. The split gate structure effectively improves the breakdown performance and the IGSS performance. A power MOS device having the split gate structure and a manufacturing method of the split gate structure are also provided.

6 Claims, 8 Drawing Sheets

SPLIT GATE STRUCTURE, POWER MOS DEVICE, AND MANUFACTURING METHOD

CROSS-REFERENCE TO RELATED APPLICATION

This application claims the priority of CN patent application No. 202010193258.3, filed on Mar. 18, 2020, which is incorporated herewith by reference.

BACKGROUND OF THE INVENTION

1. Field of the Invention

The present invention relates to the technical field of semiconductor, particularly to a split gate structure which can effectively improve the breakdown performance and the IGSS performance, a power MOS device, and a manufacturing method.

2. The Prior Arts

Generally, a split gate power MOS (split gate power FET) is used as a switching device in an integrated circuit. When the device is turned off, it is preferable to have a small leakage, otherwise, the electric device will be power consuming. As such, the IGSS performance and the breakdown performance are important parameters for evaluating the performance of a split gate power MOS. Therefore, the improvement of the breakdown performance and the IGSS performance of a split gate power MOS becomes a problem to be solved in the technical field of semiconductor.

SUMMARY OF THE INVENTION

In order to solve the existing technical problem, a split gate structure which can effectively improve the breakdown performance and the IGSS performance, a power MOS device having the same, and a manufacturing method of the same are provided in the present invention.

According to the present invention, a split gate structure is provided. The split gate structure comprises a first polysilicon, a characteristic oxide, and a second polysilicon sequentially disposed in a trench in a vertical direction upward from a bottom of the trench. An upper surface of the characteristic oxide has a height difference less than 1500 Å between a higher center portion and a lower periphery portion.

According to one embodiment of the present invention, the characteristic oxide is further disposed between the first polysilicon and a wall and the bottom of the trench.

According to one embodiment of the present invention, an effective distance between the first polysilicon and the second polysilicon, which is the smallest distance between the first polysilicon and the second polysilicon, is larger than 0.2 mm.

According to the present invention, a power MOS device is provided. The power MOS device comprises any split gate structure as described above.

According to the present invention, a manufacturing method of a split gate structure is provided. The manufacturing method comprises:
 step 1: performing an etching back process on a first polysilicon in a trench with a characteristic oxide on a wall thereof;
 step 2: performing a first etching process on the first polysilicon;
 step 3: dipping in an acid solution such that a portion of the characteristic oxide is removed;
 step 4: performing a second etching process on the first polysilicon such that the first polysilicon has a height lower than a height of the characteristic oxide disposed in the trench;
 step 5: performing a thermal oxidation process such that a characteristic oxide with an upper surface having a height difference less than 1500 Å between a higher center portion and a lower periphery portion is formed on a top of the first polysilicon; and
 step 6: depositing a second polysilicon in the trench.

According to one embodiment of the present invention, in said step 4, a height difference between the first polysilicon and the characteristic oxide is 0.05 to 0.15 mm.

According to one embodiment of the present invention, an effective distance between the first polysilicon and the second polysilicon, which is the smallest distance between the first polysilicon and the second polysilicon, is larger than 0.2 mm.

Since the technical solutions as described above are adopted, the present invention has the following advantages over the existing technology. Compared to a conventional split gate structure, in the new split gate structure fabricated by the manufacturing method of a split gate structure according to the present invention, the flatness of the contact surface between the characteristic oxide and the polysilicon is improved, and thereby the effective distance between the first polysilicon and the second polysilicon is increased. As such, the breakdown performance and the IGSS performance of the split gate power MOS are effectively improved.

DETAILED DESCRIPTION OF THE PREFERRED EMBODIMENTS

The present invention will be described in detail through the following embodiments with appending drawings such that the objectives, technical solutions, and advantages of the present invention will be more clear. It should be understood that the specific embodiments are provided for an illustrative purpose only, and should not be interpreted in a limiting manner.

Figure 1:
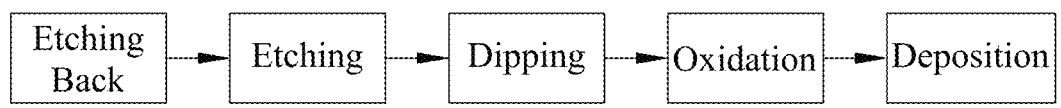
FIG. 1 is a flow diagram of the manufacturing processes of a split gate structure according to the existing technology.
Figure 2A:
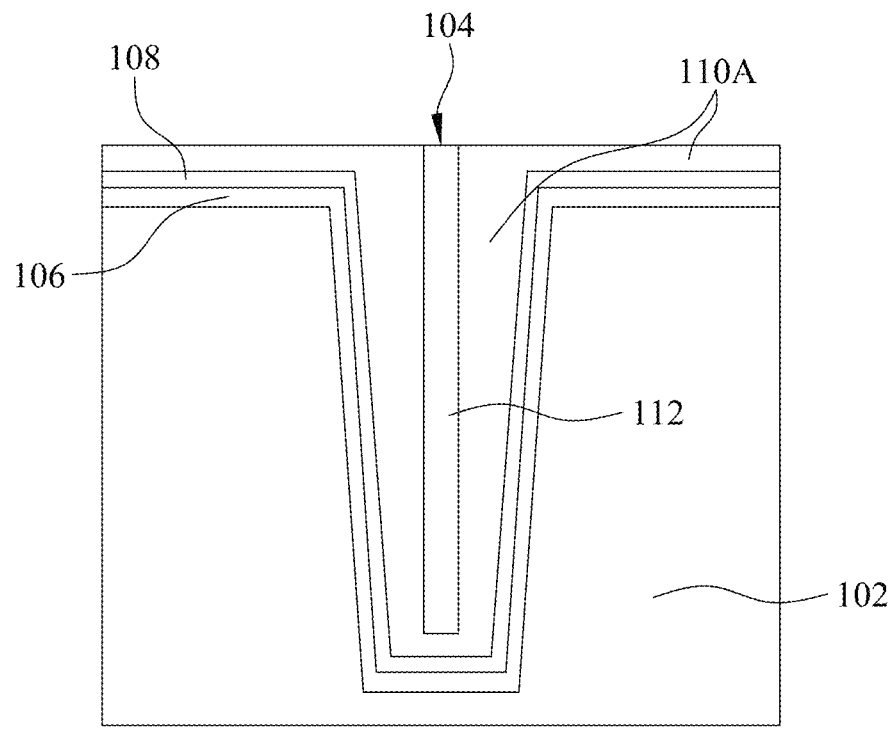
FIGS. 2A-2E illustrate the manufacturing processes of a split gate structure of FIG. 1.

As illustrated in FIG. 1 and FIGS. 2A-2E, a conventional manufacturing method typically comprises the processes of etching back-etching-dipping-oxidation-deposition. Specifically, an etching back process is firstly performed on a first polysilicon 112 in a trench 104 with a characteristic oxide 110A on a wall thereof such that the first polysilicon 112 has a height higher than a depth of the trench 104 (FIG. 2A).

Figure 2B:
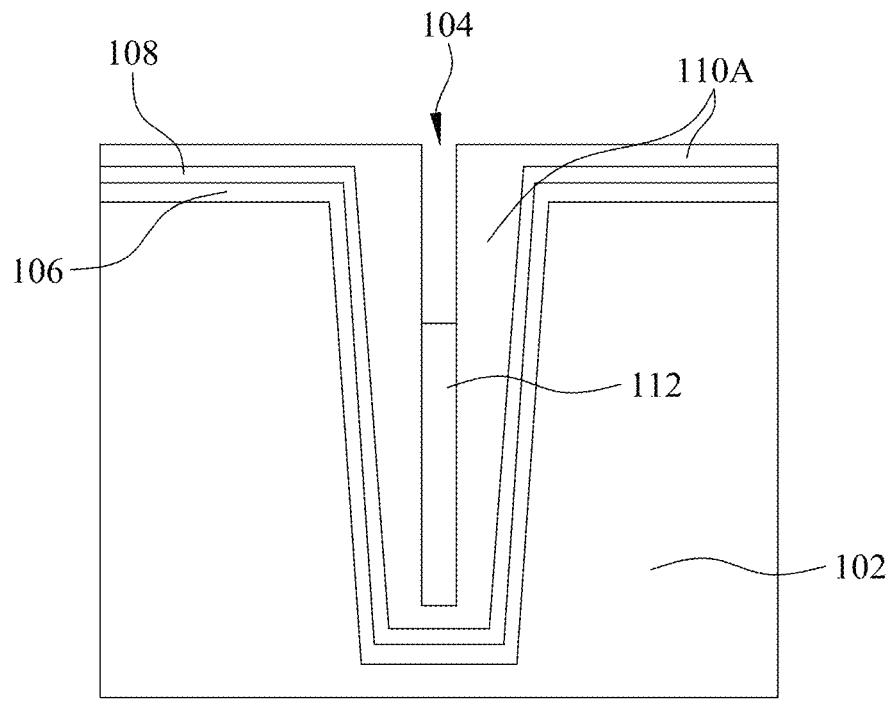
Figure 2C:
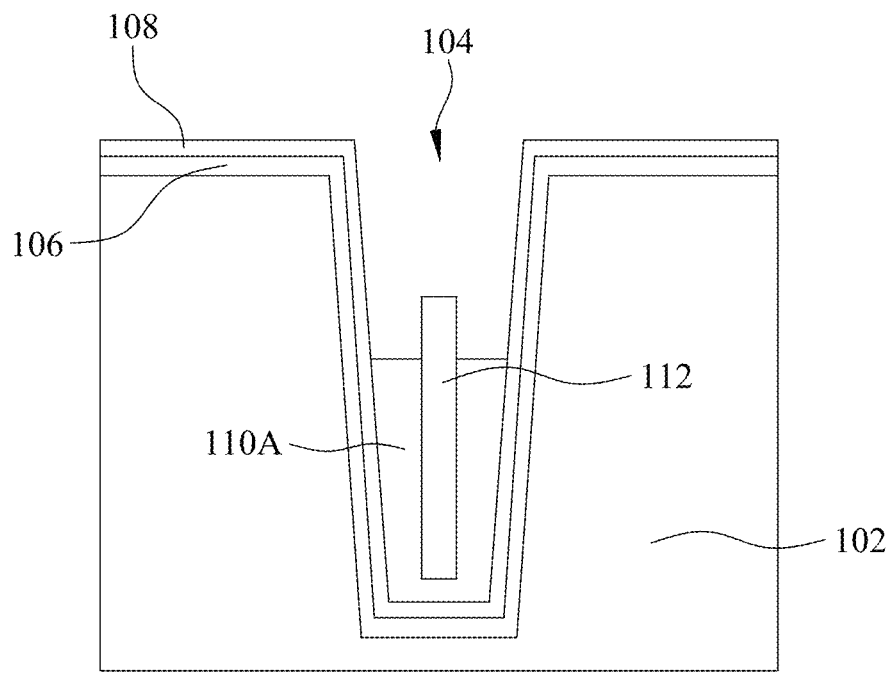
Figure 2D:
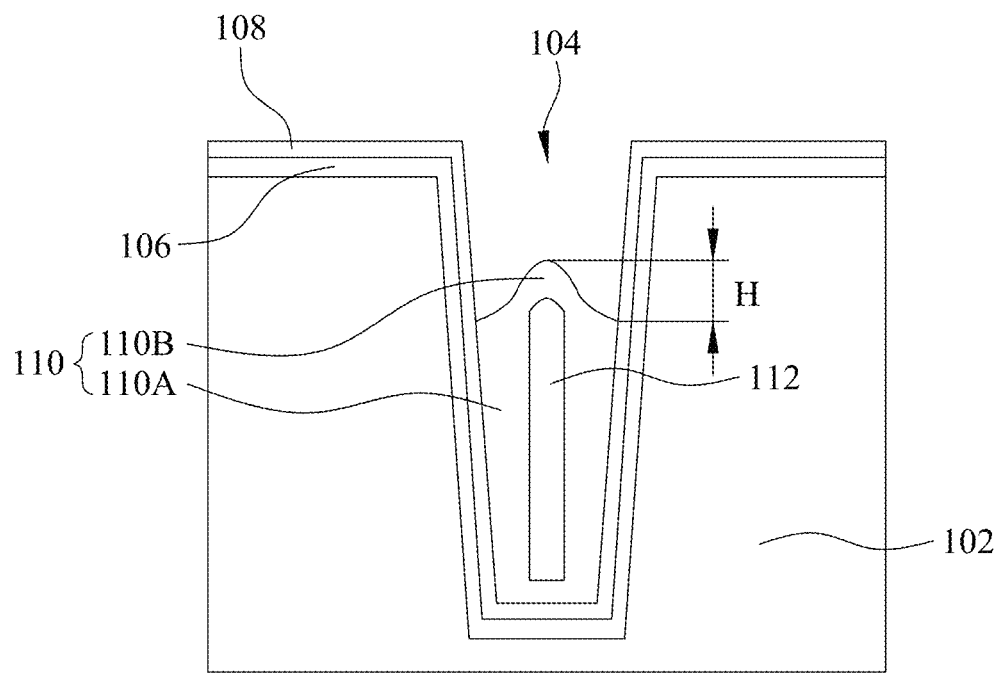
Figure 2E:
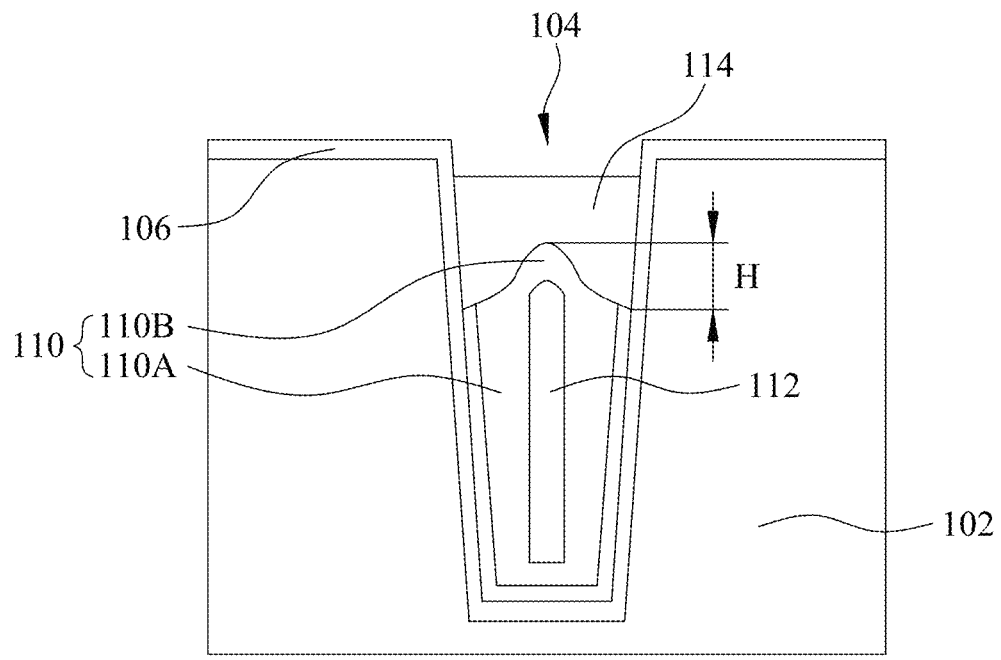
Figure 3:
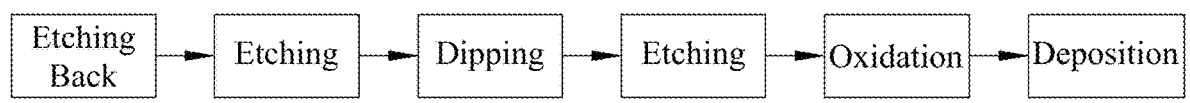
FIG. 3 is a flow diagram of the manufacturing processes of a split gate structure according to embodiments of the present invention.

Then, a first etching process is performed on the first polysilicon 112 such that the first polysilicon 112 has a height lower than the depth of the trench 104 (FIG. 2B). A dipping step is performed, in which the split gate is dipped into an acid solution such that a portion of the characteristic oxide 110A at an upper part of the trench 104 is removed. At this time, the first polysilicon 112 has a height higher than a height of an upper surface of the characteristic oxide 110A in the trench 104 (FIG. 2C). Thereafter, a layer of characteristic oxide 110B is formed on a top of the first polysilicon 112 by means of illumination or the like (FIG. 2D). The newly formed characteristic oxide 110B is combined with the original characteristic oxide 110A and together form the characteristic oxide 110. As such, the first polysilicon 112 is isolated from the empty space at the upper part of the trench 104. Finally, a second polysilicon 114 is deposited into the empty space at the upper part of the trench 104, and a split gate structure is formed (FIG. 2E). Because the first polysilicon 112 has a height higher than a height of an upper surface of the original characteristic oxide 110A, the characteristic oxide 110B formed by the oxidation of the first polysilicon 112 is higher than the original characteristic oxide 110A. As such, the characteristic oxide 110 between the first polysilicon 112 and the second polysilicon 114 typically has a convex configuration, i.e., an upper surface of the characteristic oxide 110 has a larger height difference H between a higher center portion and a lower periphery portion. Such a convex configuration leads to a nonuniform thickness distribution of the characteristic oxide 110. Therefore, an effective distance, i.e., the smallest distance, between the first polysilicon 112 and the second polysilicon 114 is smaller. The problems of breakdown, leakage, and the like are prone to occur in weak areas of the characteristic oxide 110. In one embodiment, as shown in FIG. 2A, the trench 104 is formed in a substrate 102, and an oxide 106 and SiN 108 may be optionally formed on the substrate 102 having the trench 104.

Figure 4A:
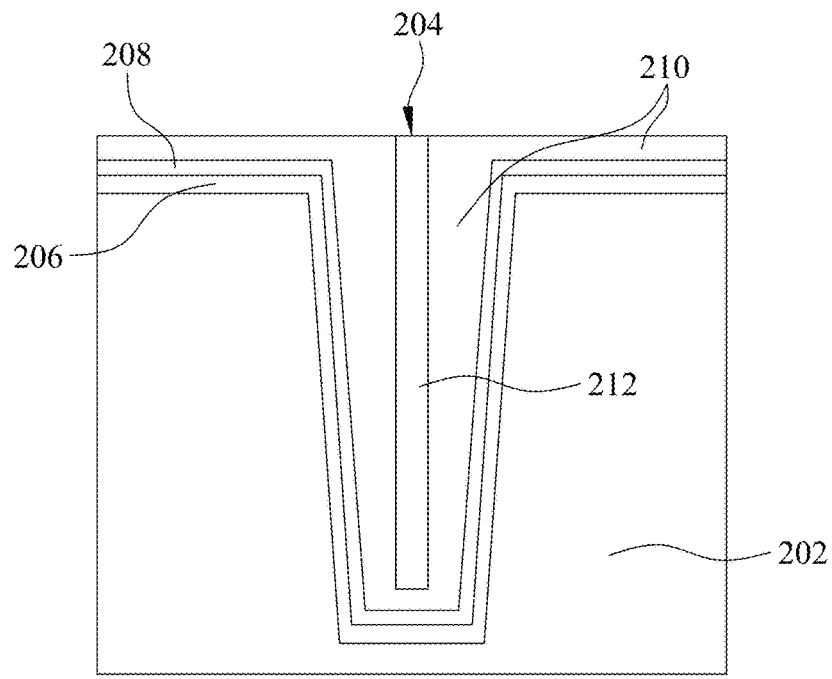
FIGS. 4A-4F illustrate the manufacturing processes of a split gate structure of FIG. 3.
Figure 4B:
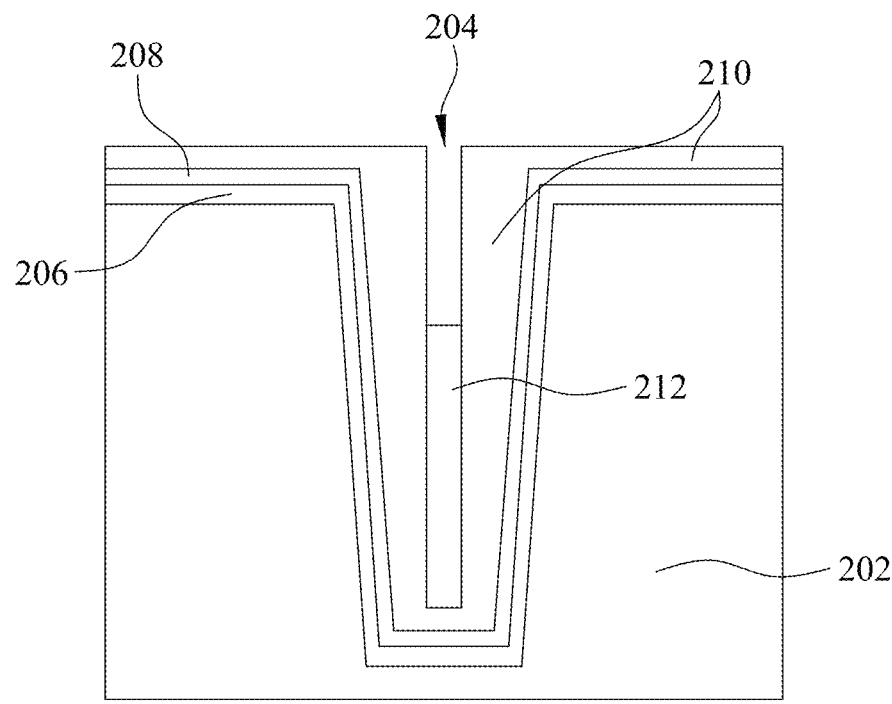
Figure 4C:
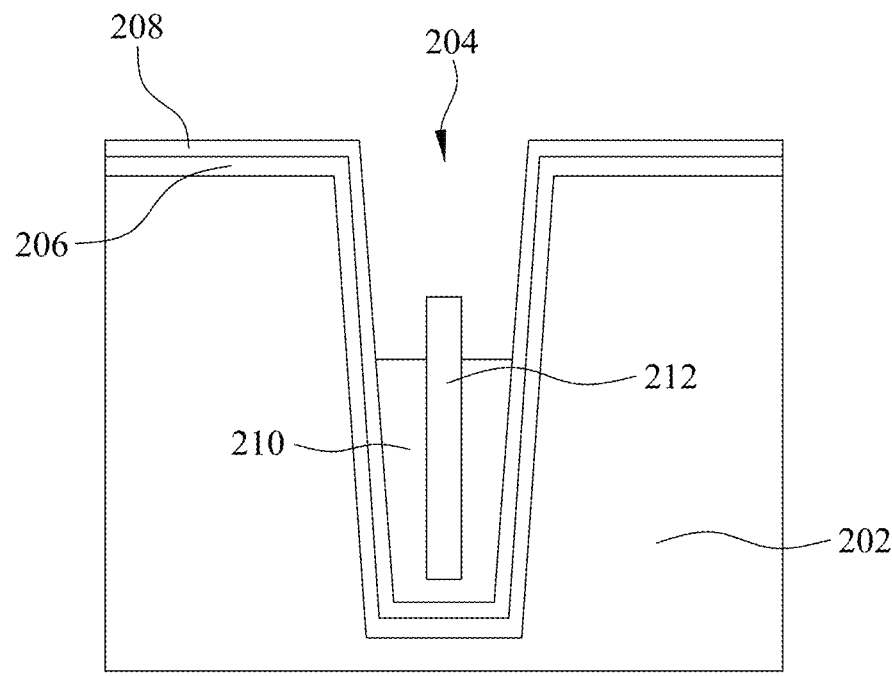
Figure 4D:
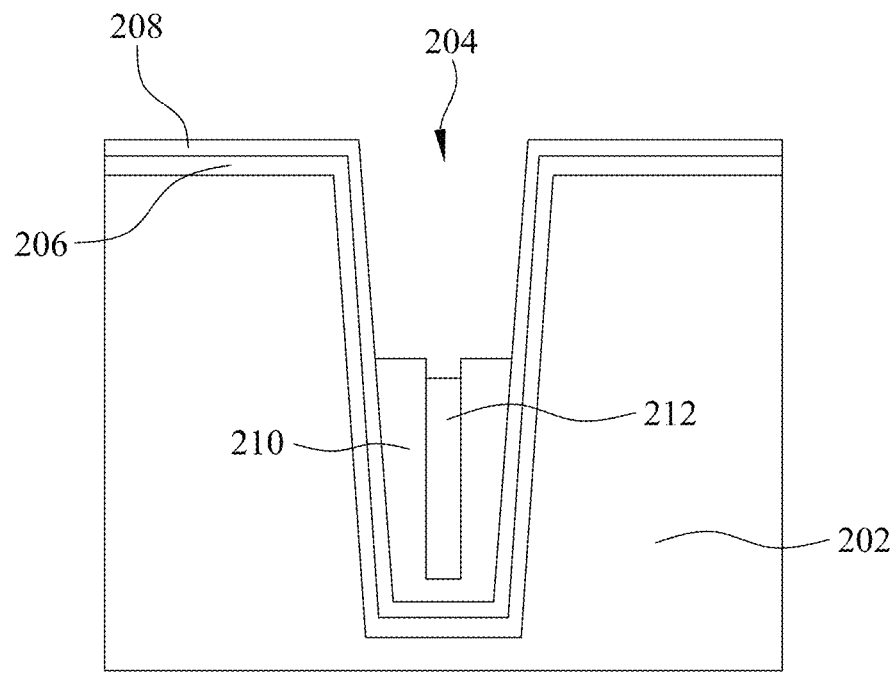
Figure 4E:
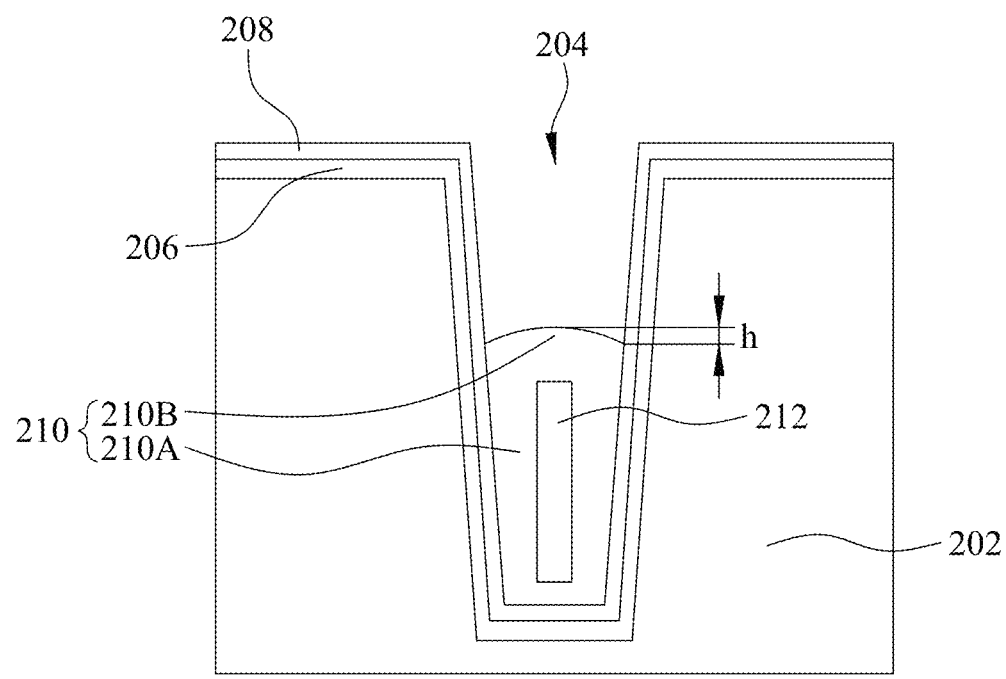
Figure 4F:
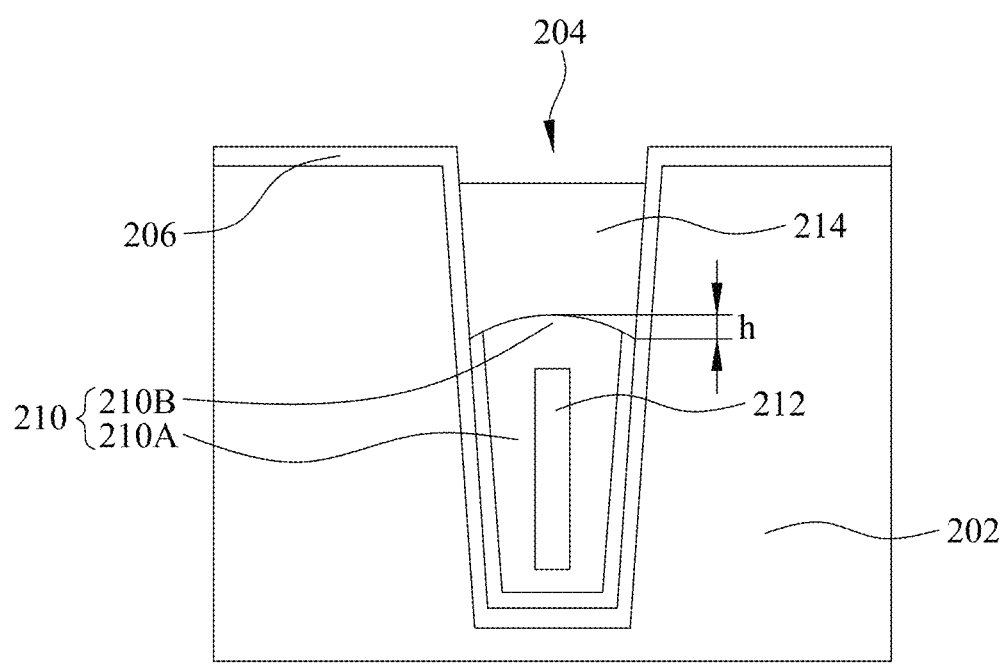

FIG. 3 and FIGS. 4A-4F illustrate a manufacturing method of a split gate structure according to the present invention. Compared to the conventional manufacturing method, a second etching step is additionally performed before the oxidation step such that the split gate structure as fabricated has a substantially flat characteristic oxide layer. Specifically, the manufacturing method of a split gate structure according to the present invention comprises:

step 1: performing an etching back process on a first polysilicon 212 in a trench 204 with a characteristic oxide 210A on a wall thereof such that the first polysilicon 212 has a height higher than a depth of the trench 204 (FIG. 4A);

step 2: performing a first etching process on the first polysilicon 212 such that the first polysilicon 212 has a height lower than the depth of the trench 204 (FIG. 4B);

step 3: performing a dipping process on the split gate, in which the split gate is dipped into an acid solution such that a portion of the characteristic oxide 210A at an upper part of the trench 204 is removed, and at this time, the first polysilicon 212 has a height higher than a height of an upper surface of the characteristic oxide 210A in the trench 204 (FIG. 4C);

step 4: performing a second etching process on the first polysilicon 212 such that the first polysilicon 212 has a height lower than a height of the characteristic oxide 210A disposed in the trench 204 (FIG. 4D), wherein, preferably, a height difference between the first polysilicon 212 and the characteristic oxide 210A is 0.05 to 0.15 mm;

step 5: forming a characteristic oxide 210B on a top of the first polysilicon 212 by means of illumination or the like, wherein the newly formed characteristic oxide 210B is combined with the original characteristic oxide 210A and together form the characteristic oxide 210, and as such, the first polysilicon 212 is isolated from the empty space at the upper part of the trench 204 (FIG. 4E), and wherein because the first polysilicon 212 has a height lower than a height of an upper surface of the original characteristic oxide 210A, the characteristic oxide 210B formed by the oxidation of the first polysilicon 212 has an upper surface substantially flush with an upper surface of the original characteristic oxide 210A, therefore finally a flat upper surface is formed, and, preferably, an upper surface of the characteristic oxide 210 has a height difference h less than 1500 Å between a higher center portion and a lower periphery portion; and step 6: finally, a second polysilicon 214 is deposited into the empty space at the upper part of the trench 204, and a split gate structure is formed (FIG. 4F).

The new split gate structure fabricated by the method described above has a characteristic oxide 210 with a flat surface and a uniform thickness distribution, it makes the effective distance, i.e., the smallest distance, between the first polysilicon 212 and the second polysilicon 214 significantly larger than that in the existing technology, preferably, the effective distance is larger than 0.2 mm, and thereby the anti-breakdown performance and the anti-leakage performance at the characteristic oxide 210 are effectively improved. In one embodiment, as shown in FIG. 4A, the trench 204 is formed in a substrate 202, and an oxide 206 and SiN 208 may be optionally formed on the substrate 202 having the trench 204.

Figure 5:
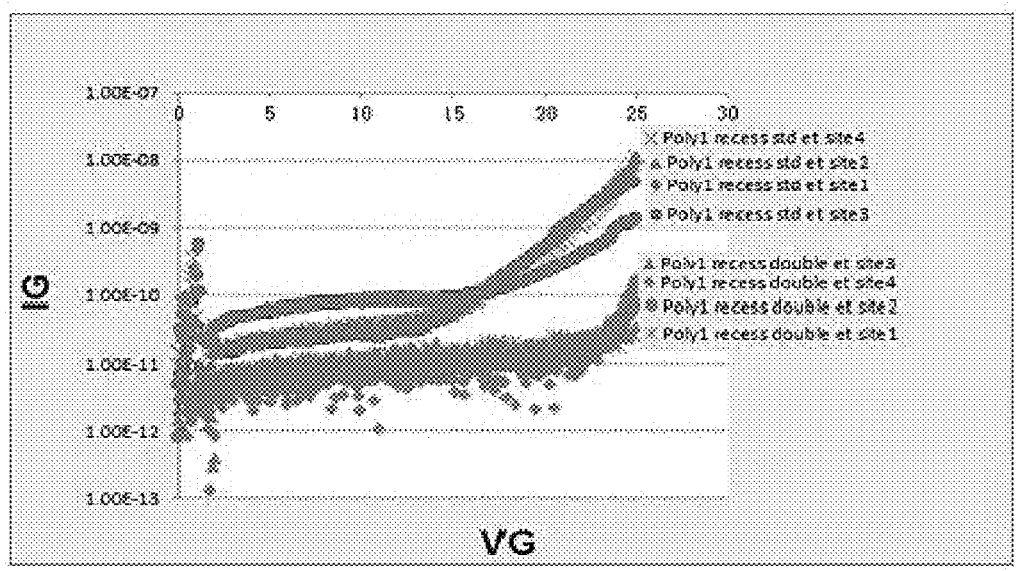
FIG. 5 shows the composition of leakage performance between a split gate according to the present invention and a split gate according to the existing technology.
Figure 6:
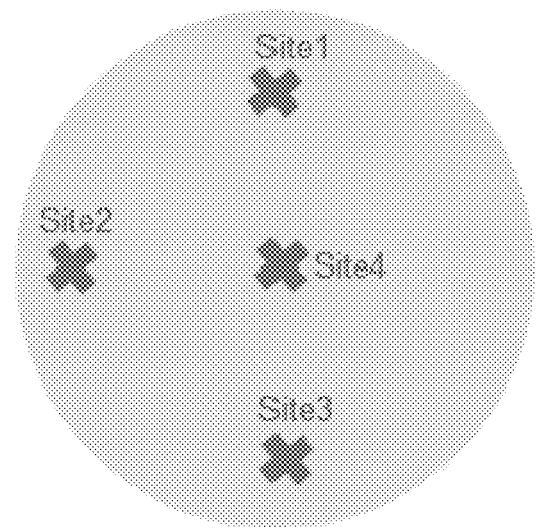
FIG. 6 illustrates the test sites for the leakage test of FIG. 5.

FIG. 5 shows the composition result of leakage performance between a split gate according to the present invention and a split gate according to the existing technology, wherein VG on the x-axis represents the energizing voltage, and IG on the y-axis represents the energizing current. Specifically, various sites (Site1, Site2, Site3, Site4) on a wafer having split gates through one etching process (Poly 1 recess std et) and on a wafer having split gates through two etching processes (Poly 1 recess double et) are energized, wherein the specific energized sites are illustrated in FIG. 6. The composition result shows that: (1) in the entire energizing process, all the current values of the split gates through one etching process are significantly larger than the current values of the split gates through two etching processes at the same voltage, and it means that the split gates through two etching processes have better anti-leakage performance than that of the split gates through one etching process; and (2) as the increase of voltage, the anti-leakage advantage of the split gates through two etching processes increases. These further proves that, in a new split gate structure fabricated by the manufacturing method according to the present invention, the breakdown performance and the IGSS performance of the split gate power MOS are effectively improved compared to a conventional split gate structure.

While the present invention has been described in terms of the specific and detailed embodiments, the present invention is not limited thereto. It should be understood that various modifications and variations can be made without departing the scope and spirit of the present invention, and these modifications and variations therefore should be encompassed in the present invention. As such, the scopes of the present invention should be defined and indicated by the following claims and their equivalents.

What is claimed is:

1. A split gate structure, comprising:
a first polysilicon, a characteristic oxide, and a second polysilicon sequentially disposed in a trench in a vertical direction upward from a bottom of the trench;
wherein an upper surface of the characteristic oxide has a height difference less than 1500 Å between a higher center portion and a lower periphery portion; and
wherein an effective distance between the first polysilicon and the second polysilicon, which is a smallest distance between the first polysilicon and the second polysilicon, is larger than 0.2 mm.

2. The split gate structure according to claim 1, wherein the characteristic oxide is further disposed between the first polysilicon and a wall and the bottom of the trench.

3. A power MOS device, comprising:
the split gate structure according to claim 1.

4. A power MOS device, comprising:
the split gate structure according to claim 2.

5. A manufacturing method of a split gate structure, comprising:

step 1: performing an etching back process on a first polysilicon in a trench with a characteristic oxide on a wall thereof;
step 2: performing a first etching process on the first polysilicon;
step 3: dipping in an acid solution such that a portion of the characteristic oxide is removed;
step 4: performing a second etching process on the first polysilicon such that the first polysilicon has a height lower than a height of the characteristic oxide disposed in the trench;
step 5: performing a thermal oxidation process such that another characteristic oxide with an upper surface having a height difference less than 1500 Å between a higher center portion and a lower periphery portion is formed on a top of the first polysilicon; and
step 6: depositing a second polysilicon in the trench;
wherein an effective distance between the first polysilicon and a second polysilicon, which is a smallest distance between the first polysilicon and the second polysilicon, is larger than 0.2 mm.

6. The manufacturing method according to claim 5, wherein, in said step 4, a height difference between the first polysilicon and the characteristic oxide is 0.05 to 0.15 mm.

* * * * *